United States Patent
Leung et al.

[11] Patent Number: 6,065,980
[45] Date of Patent: May 23, 2000

[54] GROUNDING A PCB TO AN ENCLOSURE SUB-ASSEMBLY USING A GROUNDING SPRING

[75] Inventors: Sherman Leung, San Jose; William Blake Johnson, Palo Alto; Victor Vigdorchik, Belmont, all of Calif.

[73] Assignee: Cisco Technology, Inc., San Jose, Calif.

[21] Appl. No.: 09/106,799

[22] Filed: Jun. 29, 1998

[51] Int. Cl.⁷ ........................................... H01R 4/66
[52] U.S. Cl. ................................................. 439/92
[58] Field of Search ..................... 439/92, 95, 884; 174/51, 35 GC

[56] References Cited

U.S. PATENT DOCUMENTS

| | | | |
|---|---|---|---|
| 5,386,343 | 1/1995 | Pao | 361/761 |
| 5,545,843 | 8/1996 | Arvidsson et al. | 174/35 GC |
| 5,615,089 | 3/1997 | Yoneda et al. | 361/764 |
| 5,831,833 | 11/1998 | Shirakawa et al. | 361/762 |

OTHER PUBLICATIONS

"Specification for MOD–Shield Modular Shielding System™", BMI, Inc., Palatine, IL.

*Primary Examiner*—Paula Bradley
*Assistant Examiner*—Antoine Ngandjui
*Attorney, Agent, or Firm*—D'Alessandro & Ritchie

[57] ABSTRACT

Grounding a PCB to an enclosure sub-assembly is accomplished using a specially designed spring. The spring contains a base portion, an inclined portion and a head portion. Holes are provided in the base portion of the spring to allow for soldering to make a much stronger bond, reducing the chance of separation. A tab is provided on the top portion to reduce snagging nearby objects during installation. Notches are placed between the head portion and flaps connected to he head portion in order to reduce tearing that may occur during manufacture. The spring may then be used with a specially designed enclosure sub-assembly having a drawn feature, the drawn feature engaging the spring and compressing it, allowing grounding to occur. The drawn feature allows for the single spring design to be used in a wide variety of products.

3 Claims, 6 Drawing Sheets

GROUNDING A PCB TO AN ENCLOSURE SUB-ASSEMBLY USING A GROUNDING SPRING

BACKGROUND OF THE INVENTION

1. Field of the Invention

The present invention relates to the field of printed circuit boards. More specifically, the present invention relates to using a surface mountable grounding spring to ground a printed circuit to an enclosure sub-assembly or chassis which is referenced to ground and contains the circuit board.

2. The Background Art

A printed circuit board (PCB) generally emits electromagnetic interference (EMI). Electromagnetic compatibility (EMC) standards strictly define 1) allowable levels of EMI which may be emitted by an electronic device and 2) levels of EMI to which an electronic device must be immune. In order to meet these EMC standards, it is generally necessary to tie the ground of a printed circuit board to the grounded electrically conductive enclosure sub-assembly or chassis containing the circuit board.

Figure 1:
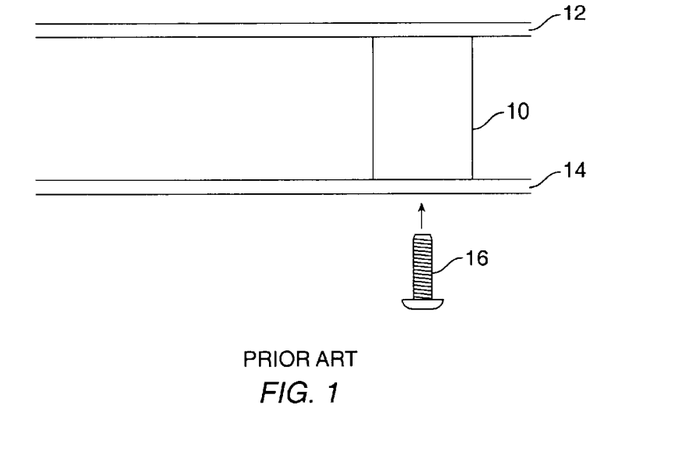
FIG. 1 is a diagram illustrating a PCB grounded to an enclosure sub-assembly using a screw and standoff as known in the prior art.

Traditionally, this grounding has been accomplished using a screw and standoff. FIG. 1 is a diagram illustrating a PCB grounded to an enclosure using a screw and standoff. Standoff 10 may be attached to an enclosure sub-assembly 12 by press fitting or using some other attachment technique. PCB 14 is then attached to the standoff 10 using a screw 16. The standoff 10 has a hole in its interior with threads for receiving the screw 16. Screw 16 is passed through a hole in the PCB and threaded into the hole in the standoff 10, securing the PCB to the standoff. The standoff then acts as a conductor to ground the PCB to the enclosure sub-assembly.

Figure 2:
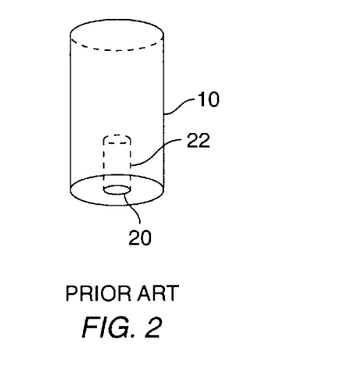
FIG. 2 is diagram showing a perspective view of the standoff illustrated in FIG. 1.

FIG. 2 is a perspective view of the standoff 10 of FIG. 1. A hole 20 in the standoff 10 leads to an open shaft 22 containing threads for receiving a screw. The standoff 10 is generally cylindrical in shape, but there are many different shapes which may be used for the standoff 10.

There are several drawbacks to using the screw and standoff method of grounding a PCB to an enclosure sub-assembly. First, a hole must be placed in the PCB for the screw to pass through and attach to the standoff. However, the space taken up by even a small hole in the printed circuit board wastes valuable portions of the PCB. Without the hole, the PCB could contain more routing connections or other circuits. Designers of the printed circuit board must design around a hole in the circuit board, adding time and money to the design phase of the board. In many situations designers cannot ground the PCB to the chassis where needed because nearby components prevent placing a hole in the PCB.

Second, there is a great deal of assembly time and labor cost added due to the manual operation of inserting the screw through the PCB and into the standoff. It would be preferable to design a grounding apparatus that could be assembled by a machine.

Third, the cost of both a standoff and a screw can be expensive since there are two separate parts that must be purchased or manufactured. It would be preferable to accomplish the same tasks using a single piece of hardware.

Figure 3:
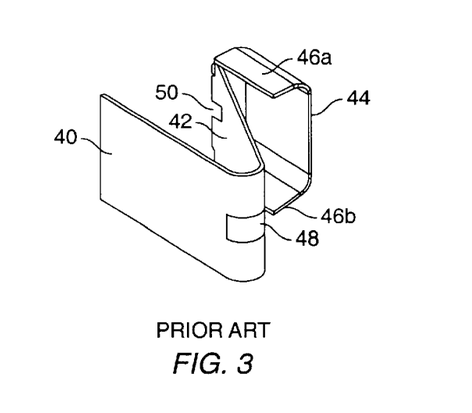
FIG. 3 is a diagram illustrating a perspective view of the BMI spring.

An alternative design for grounding a PCB to an enclosure sub-assembly was created by Boldt Metronics International (BMI). This design utilizes a spring to ground the PCB to the enclosure sub-assembly. FIG. 3 is a diagram illustrating a perspective view of the BMI spring. It comprises a substantially flat base portion 40, a substantially flat inclined portion 42, a substantially flat head portion 44, a substantially flat first flap 46a, and a substantially flat second flap 46b. One end of the inclined portion 42 is adjacent to the base portion 40 and the other end of the inclined portion 42 is adjacent to the head portion 44. Each of the first flap 46a and the second flap 46b have one side adjacent to the head portion 44 as shown. The junction between the head portion 44 and the inclined portion 42 is formed by a bend which produces tension in the spring. Likewise, the junction between the base portion 40 and the inclined portion 42 is formed by a bend which also produces tension in the spring. A hole 48 is sometimes provided at the junction between the base portion 40 and the inclined portion 42 to alter the tension in the spring. Likewise, another hole 50 is provided at the junction between the head portion 44 and the inclined portion 42 for the same purpose.

Figure 4:
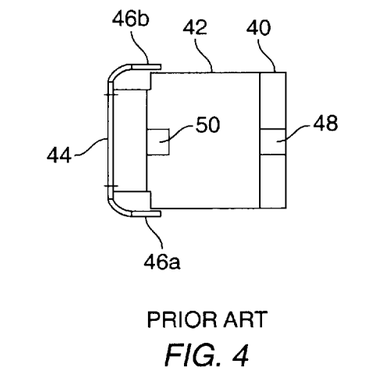
FIG. 4 is a diagram illustrating a front view of the BMI spring.
Figure 5:
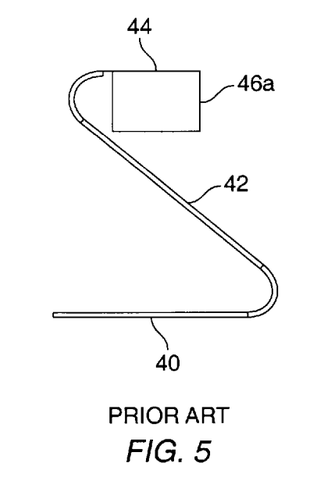
FIG. 5 is a diagram illustrating a side view of the BMI spring.
Figure 6:
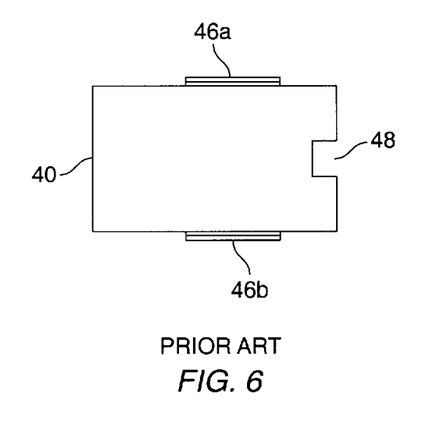
FIG. 6 is a diagram illustrating a bottom view of the BMI spring.

FIG. 4 is a diagram illustrating a front view of the BMI spring. FIG. 5 is a diagram illustrating a side view of the BMI spring. FIG. 6 is a diagram illustrating a bottom view of the BMI spring.

The base portion 40 is soldered to a PCB. Because there is no screw mechanism, a hole need not be made in the PCB so there is significantly more room on the PCB for additional circuity. The enclosure sub-assembly is then placed against the PCB such that the head portion abuts the enclosure sub-assembly, allowing grounding to occur. The flexibility of the spring allows for more room for maneuverability in the distance between the PCB and the enclosure sub-assembly. Thus, small variations in the distance between the two will not cause damage to the PCB and the connection between the two will be maintained.

The BMI spring, however, has several drawbacks. First, it is still necessary to manufacture different sized springs for products whose distances between the PCB and the enclosure sub-assembly vary greatly. Each of the springs is a small component that must be shaped and formed from metal which requires separate and unique tooling. Thus, producing additional designs adds a significant cost to the price of manufacture. It would be advantageous if a single spring design could be produced that would be compatible with a variety of products.

Second, during installation of the PCB onto the chassis, there is a tendency for the head portion of the spring to get snagged on nearby objects. This increases the time required to install the PCB and can even lead to damage of the spring or nearby components.

Third, the bond between the base portion of the BMI spring and the PCB is not always strong enough. The screw and standoff method benefitted from the fact that if a force was applied to move the standoff upwards, a reciprocal downwards pushing force would be applied by the junctions between the threads of the screw and the standoff. The BMI spring only has a flat portion soldered to another flat portion, thus a peeling force on the spring does not encounter sufficient sheer strength, but instead primarily its tensile strength. It would be preferable to have a design that could have more sheer strength in the joint between the spring and the solder.

Fourth, the BMI spring is formed by cutting a flat sheet of metal and then bending it in the appropriate directions. When machines bend metal, however, there is a tendency for the metal to tear at the bending point, especially when bending to a rigid 90 degree angle. It would be preferable to have a design that was less prone to tearing.

BRIEF DESCRIPTION OF THE INVENTION

Grounding a PCB to an enclosure sub-assembly is accomplished using a specially designed spring. The spring contains a base portion, an inclined portion and a head portion. Holes are provided in the base portion of the spring to allow for soldering to make a much stronger bond, reducing the chance of separation. A tab is provided on the top portion to reduce snagging nearby objects during installation. Notches are placed between the head portion and flaps connected to he head portion in order to reduce tearing that may occur during manufacture. The spring may then be used with a specially designed enclosure sub-assembly having a drawn feature, the drawn feature engaging the spring and compressing it, allowing grounding to occur. The drawn feature allows for the single spring design to be used in a wide variety of products.

DETAILED DESCRIPTION OF THE INVENTION

Those of ordinary skill in the art will realize that the following description of the present invention is illustrative only and not in any way limiting. Other embodiments of the invention will readily suggest themselves to such skilled persons.

A spring may be designed with a tab feature that reduces the chances of the spring getting caught or snagged on nearby components during installation of the PCB. Additionally, circular holes may be placed in the base portion of the spring to improve solderability and allow a bond which provides greater sheer strength in addition to tensile strength in response to a peeling force applied to the spring. Notches may be provided in the head portion to reduce the chance of tearing the spring. Enclosure sub-assemblies may be designed with a drawn feature, allowing the same spring to be used in virtually all products produced. By utilizing these features, it is possible to eliminate many of the drawbacks of the prior art techniques for grounding a PCB to an enclosure sub-assembly.

Figure 7:
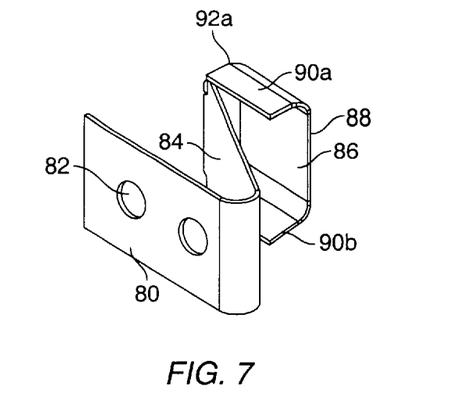
FIG. 7 is a diagram illustrating a perspective view of a grounding spring in accordance with a presently preferred embodiment of the present invention.

FIG. 7 is a diagram illustrating a perspective view of a grounding spring in accordance with a presently preferred embodiment of the present invention. Base portion 80 contains one or more holes 82. These holes are preferably circular in shape to reduce sharp edges. When base portion 80 is soldered to a PCB, a portion of the solder will flow through the holes and settle along the sides of each hole 82, forming a fillet. When the solder cools, the fillet will provide sheer strength in the joint between the spring and the solder in response to a peeling force applied to the spring. Sheer strength provides much more resistance than tensile strength in this application, and thus the spring is less likely to detach from the PCB than in prior designs.

The size of the holes 82 depends on the size of the spring, but generally the size should be large enough such that solder is able to flow through them but small enough such that there is enough room left of the base portion 80 for the solder to bond to and to support the weight of the rest of the spring as well as the eventual force applied from the enclosure sub-assembly without breaking.

One end of the base portion 80 is adjacent to one end of a substantially flat inclined portion 84. The angle between the inclined portion 84 and the base portion 80 may be between 0 and 90 degrees, but preferably it should be around 45 degrees. One end of a substantially flat head portion 86 is adjacent to the other end of the inclined portion 84. Like the angle between the inclined portion 84 and the base portion 80, the angle between the head portion 86 and the inclined portion 84 may also be between 0 and 90 degrees, preferably around 45 degrees, but whatever angles are chosen for the two junctions, they must both be nearly equal since the head portion 86 is parallel to the base portion 80.

The head portion 86 has four sides. The first side is the side adjacent to the inclined portion 84. The third side is opposite the first side and is adjacent to a substantially flat tab portion 88. The tab portion 88 may extend downwards at an angle of about 45 degrees from the head portion. The tab portion 88 functions to prevent the spring from snagging on nearby objects during installation on the PCB and greatly improves the speed of installation and decreases the likelihood of damaging the spring or nearby components.

The second side of the head portion 86 is adjacent to a substantially flat first flap 90a. The fourth side of the head portion 86 is adjacent to a substantially flat second flap 90b. Both the first flap 90a and the second flap 90b extend downwards at an angle of about 90 degrees from the head portion 86. They function to prevent the spring from being compressed too much, which could cause the enclosure sub-assembly to come in contact with the PCB, which in turn could damage the spring, Thus, the first flap 90a and second flap 90b strike the PCB when the spring is compressed a certain amount, preventing any further compression.

Notches 92a (shown in FIG. 7) and 92b (not shown in FIG. 7) are cut in the material before the spring is constructed in order to provide bend relief at the head portion. Bend relief functions to prevent the tearing of the material that can occur during folding by setting the position of the fold somewhat apart from an adjoining corner.

Figure 8:
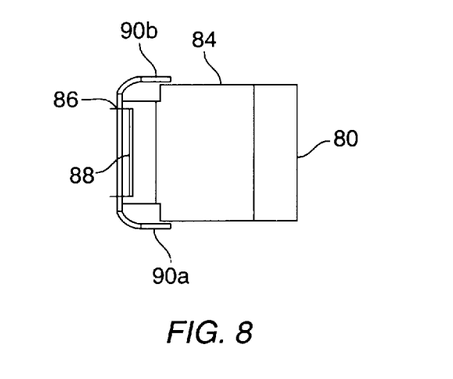
FIG. 8 is a diagram illustrating a front view of a grounding spring in accordance with a presently preferred embodiment of the present invention.
Figure 9:
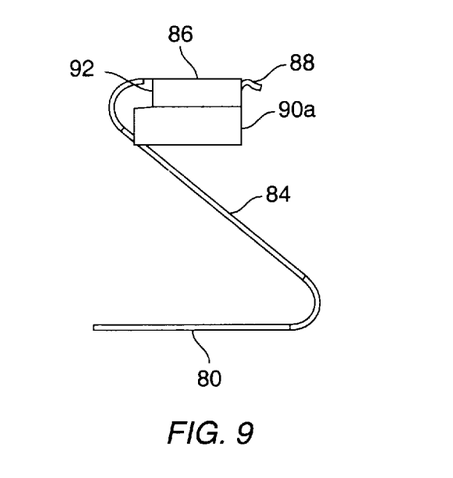
FIG. 9 is a diagram illustrating a side view of a grounding spring in accordance with a presently preferred embodiment of the present invention.
Figure 10:
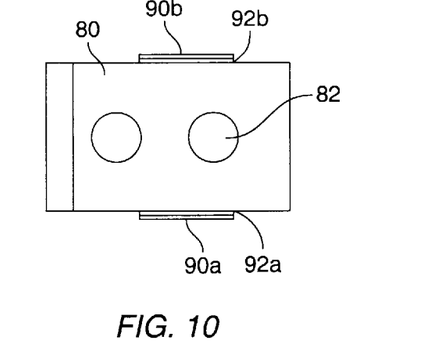
FIG. 10 is a diagram illustrating a bottom view of a grounding spring in accordance with a presently preferred embodiment of the present invention.

FIG. 8 is a diagram illustrating a front view of the spring in accordance with a presently preferred embodiment of the present invention. FIG. 9 is a diagram illustrating a side view of the spring in accordance with a presently preferred embodiment of the present invention. FIG. 10 is a diagram illustrating a bottom view of the spring in accordance with a presently preferred embodiment of the present invention. Notches 92a and 92b may both be seen in FIG. 10.

By grounding the PCB to the enclosure using a single piece of hardware, the overall cost of the product is decreased. While the price difference for a single unit will not be huge, the cost difference begins to add up over an entire system where hundreds or thousands of springs may be used.

Figure 11:
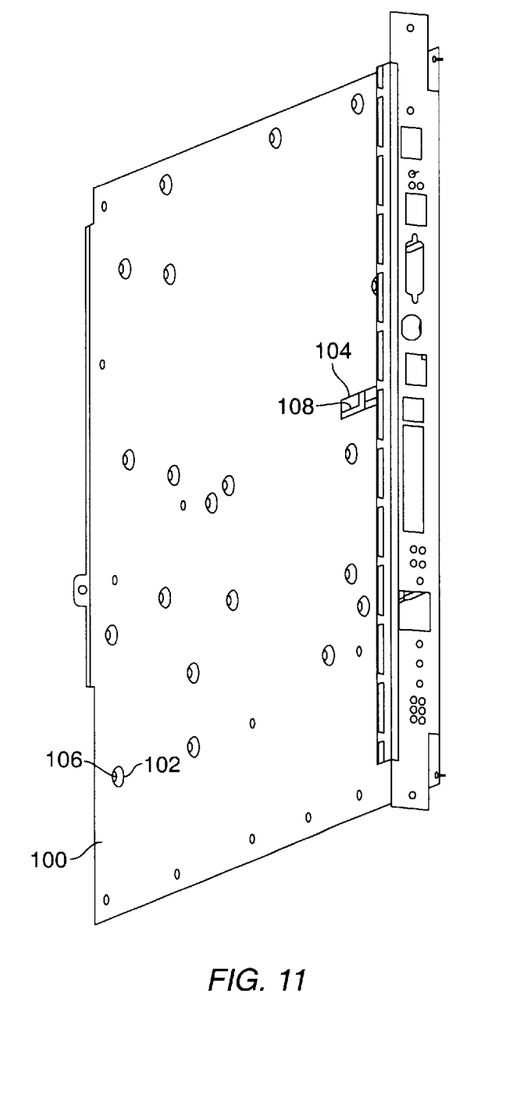
FIG. 11 is a diagram illustrating an enclosure sub-assembly in accordance with a presently preferred embodiment of the present invention.

The spring may be used with a drawn feature on an enclosure sub-assembly. FIG. 11 is a diagram illustrating an enclosure sub-assembly in accordance with the present invention. The metal enclosure sub-assembly 100 has a substantially flat portion which contains one or more drawn features 102, 104. FIG. 11 illustrates some of the different possible designs for the drawn feature, including a round drawn feature 102 and a rectangular drawn feature 104. The key component of the drawn feature is a substantially flat portion 106, 108 set apart from the enclosure sub-assembly 100.

Figure 12A:
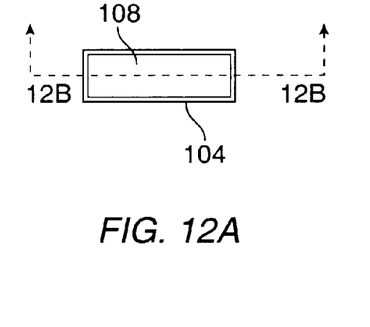
FIG. 12A is a diagram illustrating a top view of the rectangular drawn feature of FIG. 11 in accordance with a presently preferred embodiment of the present invention.
Figure 12B:
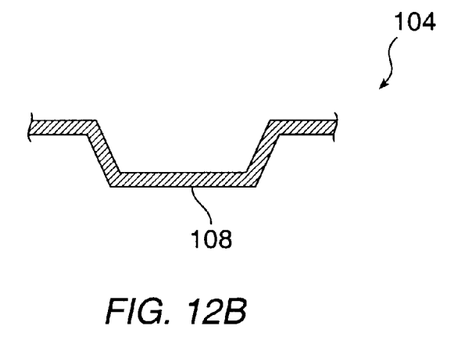
FIG. 12B is a diagram illustrating a cross-sectional view of the rectangular drawn feature taken along section line 12B—12B of FIG. 12A in accordance with a presently preferred embodiment of the present invention.

FIG. 12A is a diagram illustrating a top view of the rectangular drawn feature 104 of FIG. 11. Substantially flat portion 108 is substantially rectangular in shape. FIG. 12B is a diagram illustrating a cross sectional view of the rectangular drawn feature 104 taken along section line 12B—12B of FIG. 12A.

Figure 13A:
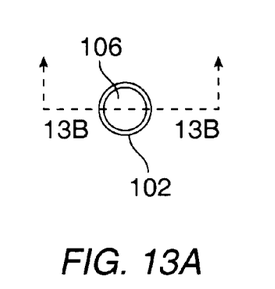
FIG. 13A is a diagram illustrating a top view of the circular drawn feature of FIG. 11 in accordance with a presently preferred embodiment of the present invention.
Figure 13B:
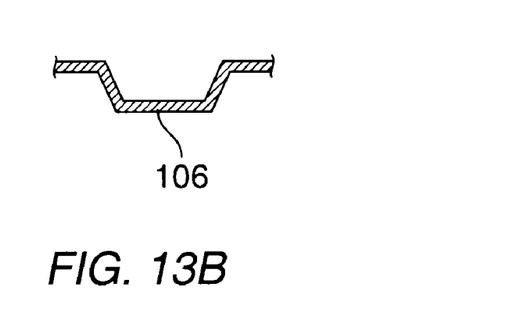
FIG. 13B is a diagram illustrating a side view of the circular drawn feature taken along section line 13B—13B of FIG. 13A in accordance with a presently preferred embodiment of the present invention.

FIG. 13A is a diagram illustrating a top view of the circular drawn feature 102 of FIG. 11. Substantially flat portion 106 is substantially circular in shape. FIG. 13B is a diagram illustrating a cross sectional view of the circular drawn feature 102 taken along section line 13B—13B of FIG. 13A.

Figure 14:
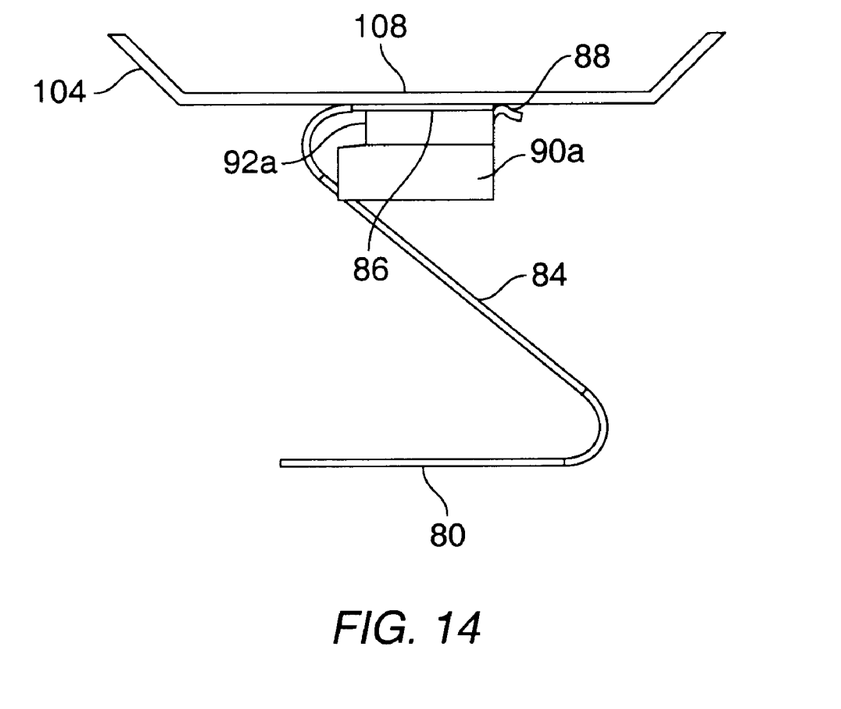
FIG. 14 is a diagram illustrating how the drawn feature of the enclosure sub-assembly and the spring may be used together in accordance with the present invention.

FIG. 14 is a diagram illustrating how the substantially flat portion 108 of a rectangular drawn feature 104 engages the spring. The substantially flat portion 108 of the drawn feature 104 is arranged to adjoin the head portion 86 of the spring, such that the substantially flat portion 108 is parallel to the head portion 86 of the spring, compressing the spring. Thus, the grounding of the PCB to the enclosure sub-assembly is complete. By utilizing the drawn feature on different enclosure sub-assemblies, it is possible to have a single spring design, which saves time and money in the design and manufacturing stage. Making drawn features of different sizes is cheap and easy, and these drawn features may be drawn from the material of the chassis at any time.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A surface mountable grounding device for grounding a PCB to a metal enclosure sub-assembly, including:

a base portion having a first end and a second end opposite said first end, said base portion being substantially flat and including a plurality of holes to aid in the soldering of the surface mountable grounding device to the PCB;

an inclined portion having a first end and a second end opposite said first end, said inclined portion being substantially flat, said first end of said inclined portion adjacent to said second end of said base portion, said inclined portion positioned over said base portion and the angle between said inclined portion and said base portion being between 0 and 90 degrees;

a head portion having a first side, a second side, a third side, and a fourth side, said first side opposite said third side and said second side opposite said fourth side, said head portion being substantially flat and parallel to said base portion, said first side of said head portion adjacent to said second end of said inclined portion, said head portion positioned over said inclined portion, and the angle between said inclined portion and said head portion being between 0 and 90 degrees;

a first flap having a first side, a second side, a third side, and a fourth side, said first side opposite said third side and a second side opposite said fourth side, said first flap being substantially flat and rectangular, said first side of said first flap adjacent to said second side of said head portion, and the plane containing said second flap being substantially perpendicular to the plane containing said head portion;

a second flap having a first side, a second side, a third side, and a fourth side, said first side opposite said third side and a second side opposite said fourth side, said second flap being substantially flat and rectangular, said first side of said first flap adjacent to said fourth side of said head portion, and the plane containing said second flap being substantially perpendicular to the plane containing said head portion; and wherein said first and second flaps each include a notch, said notches located on the side of said first and second flaps which is nearest to the junction between said head portion and said inclined portion, said notches adjacent to said head portion to reduce the chances of tearing during manufacture.

2. A surface mountable grounding device for grounding a PCB to a metal enclosure sub-assembly, including:

a base portion having a first end and a second end opposite said first end, said base portion being flat and including a plurality of holes to aid in the soldering of the surface mountable grounding device to the PCB;

an inclined portion having a first end and a second end opposite said first end, said inclined portion being flat, said first end of said inclined portion adjacent to said second end of said base portion, said inclined portion positioned over said base portion and the angle between said inclined portion and said base portion being between 0 and 90 degrees;

a head portion having a first side, a second side, a third side, and a fourth side, said first side opposite said third side and said second side opposite said fourth side, said head portion being flat and parallel to said base portion, said first side of said head portion adjacent to said second end of said inclined portion, said head portion positioned over said inclined portion, and the angle between said inclined portion and said head portion being between 0 and 90 degrees;

a first flap having a first side, a second side, a third side, and a fourth side, said first side opposite said third side and a second side opposite said fourth side, said first flap being flat and rectangular, said first side of said first flap adjacent to said second side of said head portion, and the plane containing said second flap being perpendicular to the plane containing said head portion;

a second flap having a first side, a second side, a third side, and a fourth side, said first side opposite said third side and a second side opposite said fourth side, said second flap being flat and rectangular, said first side of said first flap adjacent to said fourth side of said head portion, and the plane containing said second flap being perpendicular to the plane containing said head portion; and wherein said first and second flaps each include a notch, said notches located on the side of said first and second flaps which is nearest to the junction between said head portion and said inclined portion, said notches adjacent to said head portion to reduce the chances of tearing during manufacture.

3. A grounding system grounding a PCB to a metal enclosure sub-assembly, including:

a surface mountable grounding spring having:

a base portion having a first end and a second end opposite said first end, said base portion being flat and fixedly soldered to the PCB;

an inclined portion having a first end and a second end opposite said first end, said inclined portion being flat, said first end of said inclined portion adjacent to said second end of said base portion, said inclined portion positioned over said base portion and the angle between said inclined portion and said base portion being between 0 and 90 degrees;

a head portion having a first side, a second side, a third side, and a fourth side, said first side opposite said third side and said second side opposite said fourth side, said head portion being flat and parallel to said base portion, said first side of said head portion adjacent to said second end of said inclined portion, said head portion positioned over said inclined portion, and the angle between said inclined portion and said head portion being between 0 and 90 degrees;

a first flap having a first side, a second side, a third side, and a fourth side, said first side opposite said third side and a second side opposite said fourth side, said first flap being flat and rectangular, said first side of said first flap adjacent to said second side of said head portion, and the plane containing said second flap being perpendicular to the plane containing said head portion; and a second flap having a first side, a second side, a third side, and a fourth side, said first side opposite said third side and a second side opposite said fourth side, said second flap being flat and rectangular, said first side of said first flap adjacent to said fourth side of said head portion, and the plane containing said second flap being perpendicular to the plane containing said head portion;

a metal enclosure sub-assembly having:

a flat portion, said flat portion located above said head of said surface mountable grounding spring, said metal enclosure sub-assembly including a drawn feature, said drawn feature protruding from said metal enclosure sub-assembly towards said head of said surface mountable grounding spring and tapering to a flat surface, said drawn feature designed such that said flat surface comes in contact with said head portion of said surface mountable grounding spring and compresses said surface mountable grounding spring when the PCB is covered by the metal enclosure sub-assembly.

* * * * *

UNITED STATES PATENT AND TRADEMARK OFFICE
CERTIFICATE OF CORRECTION

PATENT NO: 6,065,980
DATED: May 23, 2000
INVENTORS: Sherman Leung, William Blake Johnson and Victor Vigdorchik It is certified that error appears in the above-identified patent and that said Letter Patent are hereby corrected as shown below:

In column 2 line 25 delete "circuity" and insert - - circuitry- -

Signed and Sealed this

Seventeenth Day of April, 2001

*Attest:*

NICHOLAS P. GODICI

*Attesting Officer*     *Acting Director of the United States Patent and Trademark Office*